(12) United States Patent
Kim

(10) Patent No.: US 7,626,333 B2
(45) Date of Patent: Dec. 1, 2009

(54) LIGHT EMITTING DISPLAY DEVICE

(75) Inventor: Hak Su Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 555 days.

(21) Appl. No.: 11/318,516

(22) Filed: Dec. 28, 2005

(65) Prior Publication Data
US 2006/0145607 A1     Jul. 6, 2006

(30) Foreign Application Priority Data
Dec. 31, 2004   (KR) ................. 10-2004-0118584

(51) Int. Cl.
*H01J 1/62* (2006.01)
*H01J 63/04* (2006.01)
(52) U.S. Cl. ............... 313/512; 313/504; 313/506; 313/498; 315/169.3
(58) Field of Classification Search ......... 313/504–512, 313/169.3; 349/58
See application file for complete search history.

(56) References Cited
U.S. PATENT DOCUMENTS
7,355,204 B2 * 4/2008 Coe ............................ 257/72

2005/0082972 A1 * 4/2005 Chen et al. ................... 313/512

* cited by examiner

*Primary Examiner*—Nimeshkumar D. Patel
*Assistant Examiner*—Thomas A Hollweg
(74) *Attorney, Agent, or Firm*—KED & Associates, LLP

(57) ABSTRACT

The present invention relates to a light emitting display device which comprises a substrate; anode electrode layers disposed over the substrate in a first direction; cathode electrode layers disposed over or under the anode electrode layers in a second direction which is different from the first direction; organic material layers disposed between the anode electrode layers and the cathode electrode layers; at least one outer wall disposed at the periphery of an active area defined by an entire area of the organic material layers; a cap attached over the at least one outer wall, wherein a substrate-forward surface of the cap is flat; a driving chip attached to the substrate-forward surface of the cap; a signal transferring part configured to electrically communicate with the driving chip, and extended to the outside of an area defined by the substrate and the cap; a pad disposed over the substrate, and configured to electrically communicate with the anode electrode layers and/or the cathode electrode layers and electrically communicate with the signal transferring part; and an external signal transferring part configured to electrically communicate with the signal transferring part and to transfer an external signal to the driving chip.

24 Claims, 3 Drawing Sheets

LIGHT EMITTING DISPLAY DEVICE

BACKGROUND OF THE INVENTION

1. Field of the Invention

The present invention relates to a light emitting display device. Particularly, the present invention relates to a light emitting display device that has less size and prevents moisture penetration by installing a driving chip within a cap.

2. Description of the Related Art

A cathode ray tube, one of the display devices, has a drawback that it is heavy and bulky. Recently, various flat display devices with less weight and volume have been developed. Such flat display devices include a liquid crystal display device, a field emission display device, a plasma display panel, and an organic electroluminescent device. Particularly, an organic electroluminescent device has a structure that electrodes are contacted at both surfaces of an organic material layer having a hole transport layer, a luminescent layer, and an electron transport layer, stacked in order. The organic electroluminescent device is now receiving attention as next generation display device due to its wide viewing angle, high aperture rate, and high chromaticity.

Organic electroluminescence is a phenomenon that excitons are formed in an organic (low molecular or high molecular) material thin layer by re-combining holes injected through an anode with electrons injected through a cathode, and a specific wavelength of light is generated by energy from the formed excitons, and thus the organic electroluminescent device can be operated by low voltage. Therefore, the device's power consumption is low, and the device's quality of color is good. Also, the organic electroluminescent device can be formed on a flexible substrate.

FIG. 1 is a plan view of an organic electroluminescent device in the related art. FIG. 2 is a cross-sectional view of the organic electroluminescent device of FIG. 1, as taken along line II-II'

In FIG. 1, the constitution disposed on a substrate 10 within a cap 40 is not illustrated for the convenience of explanation. The area defined by dotted lines means an area applied by sealant 44 and conductive bonding film 54.

Referring to FIGS. 1 and 2, the organic electroluminescent device comprises an active area 12 disposed on the substrate 10, the cap 40 surrounding the active area 12, and a driving chip 60 disposed within the cap 40 to make the active area 12 emit.

The basic structure of the organic electroluminescent device includes the substrate 10, an anode electrode layer 20 formed on the upper side of the glass substrate 10, an organic material layer 24 formed on the anode electrode layer 20, and a cathode electrode layer 22 formed to cross the anode electrode layer 20 on the organic material layer 24. Here, the structure that the anode electrode layer 20, the organic material layer 24, and the cathode electrode layer 22 are stacked in order is defined as a pixel 26. Also, the entire area of the pixels 26 is defined as the active area 12.

The organic material layer 24 has a structure that the hole transport layer, the luminescent layer, and an electron transport layer are stacked in order. Each cathode electrode layer 22 maintains a certain space from adjacent cathode electrode layers 22. The anode electrode layer 20 acts as the anode electrode, and the cathode electrode layer 22 acts as the cathode electrode.

An inner wall 30 partitions two adjacent cathode electrode layers 22. The inner wall 30 is formed in an area between two adjacent cathode electrode layers 22. The inner wall 30 is separated from the anode electrode layer 20 by an insulating layer 28. Although organic material and cathode electrode material are deposited on the upper side or the top of each inner wall 30 during the processes of forming the organic material layer 24 and cathode electrode layer 22, neither functions as a component of the device.

The cap 40 covers the active area 12 on the substrate 10 to prevent it from oxygen and moisture in the air. The cap 40 can be made of glass, and a recessed space is formed in the center of the cap 40 by sand blasting process. Here, the recessed space of the cap 40 has enough height not to contact the elements disposed in the active area 12. Also, a getter 42 is disposed within the cap 40 to absorb oxygen and moisture.

The driving chip 60 is installed within the cap 40. The driving chip 60 generates data signal transferred to the anode electrode layer 20 in the active area 12. The driving chip 60 is electrically communicated with a first flexible printed circuit 62.

As shown in FIG. 1, in the area that the cap 40 is attached to the substrate 10 (the area illustrated by dotted lines), the conductive bonding film 54 is applied to the area which the pad 52 crosses, and the sealant 44 is applied to the remaining area. An anisotrophic conductive film is preferable as the conductive bonding film 54.

External signals (hereinafter, referred to as "external signal") is transferred from the external device (not shown) to the pad 52 through a second flexible printed circuit 50, and is transferred to the driving chip 60 through the conductive bonding film 54 and the first flexible printed circuit 62. Therefore, the driving chip 60 responds to the external signal to generate data signal and scan signal.

Data signal and scan signal generated from the driving chip 60 is transferred to the active area 12 through the first flexible printed circuit 62, the conductive bonding film 54, and the pad 52. Thus, the pixels 26 in the active area 12 are emitted.

This organic electroluminescent device in the art has drawbacks that the manufacturing process is complicated, and the manufacturing cost is high because the recessed space is formed on the glass cap by sand blasting process. Also, moisture can penetrate more through the area that the cap 40 is attached to the substrate 10 by the conductive bonding film 54 than the area applied by the sealant 44. Therefore, the organic electroluminescent device is degraded by moisture penetration through the area applied by the conductive bonding film 54.

SUMMARY OF THE INVENTION

An object of the present invention is to provide a light emitting device like organic electroluminescent device that has less size and prevents moisture penetration by installing a driving chip within the cap.

The light emitting device according to an aspect of the present invention comprises a substrate; anode electrode layers disposed over the substrate in a first direction; cathode electrode layers disposed over or under the anode electrode layers in a second direction which is different from the first direction; organic material layers disposed between the anode electrode layers and the cathode electrode layers; at least one outer wall disposed at the periphery of an active area defined by an entire area of the organic material layers; a cap attached over the at least one outer wall, whererin a substrate-forward surface of the cap is flat; a driving chip attached to the substrate-forward surface of the cap; a signal transferring part configured to electrically communicate with the driving chip, and extended to the outside of an area defined by the substrate and the cap; a pad disposed over the substrate, and configured to electrically communicate with the anode electrode layers and/or the cathode electrode layers and electrically communicate with the signal transferring part; and an external signal transferring part configured to electrically communicate with the signal transferring part and to transfer an external signal to the driving chip. The signal transferring part can be extended through between the cap and the at least one outer wall.

The light emitting device according to another aspect of the present invention comprises a substrate; pixels disposed over the substrate; at least one outer wall disposed at the periphery of an active area defined by an entire area of the pixels; a cap attached over the at least one outer wall; a driving chip attached to a substrate-forward surface of the cap; a signal transferring part configured to electrically communicate with the driving chip extended to the outside of an area defined by the substrate and the cap; a pad disposed over the substrate, and configured to electrically communicate with the pixels and electrically communicate with the signal transferring part; and an external signal transferring part configured to electrically communicate with the signal transferring part and transfer an external signal to the driving chip.

The light emitting display device prevents moisture and oxygen penetration by forming the outer walls on the substrate and attaching the cap to the substrate only with the sealant without the conductive bonding film. Thus, the life of the device can be extended by preventing degradation of the device. And, the size of the substrate can be decreased by installing the driving chip within the cap. Also, the manufacturing cost of the device can be decreased by using the flat cap.

BRIEF DESCRIPTION OF THE DRAWING

The present invention will be more clearly understood from the detailed description in conjunction with the following drawings.

DETAILED DESCRIPTION OF THE INVENTION

The present invention will be more clearly understood from the detailed description in conjunction with FIGS. 3 to 6.

Figure 3:
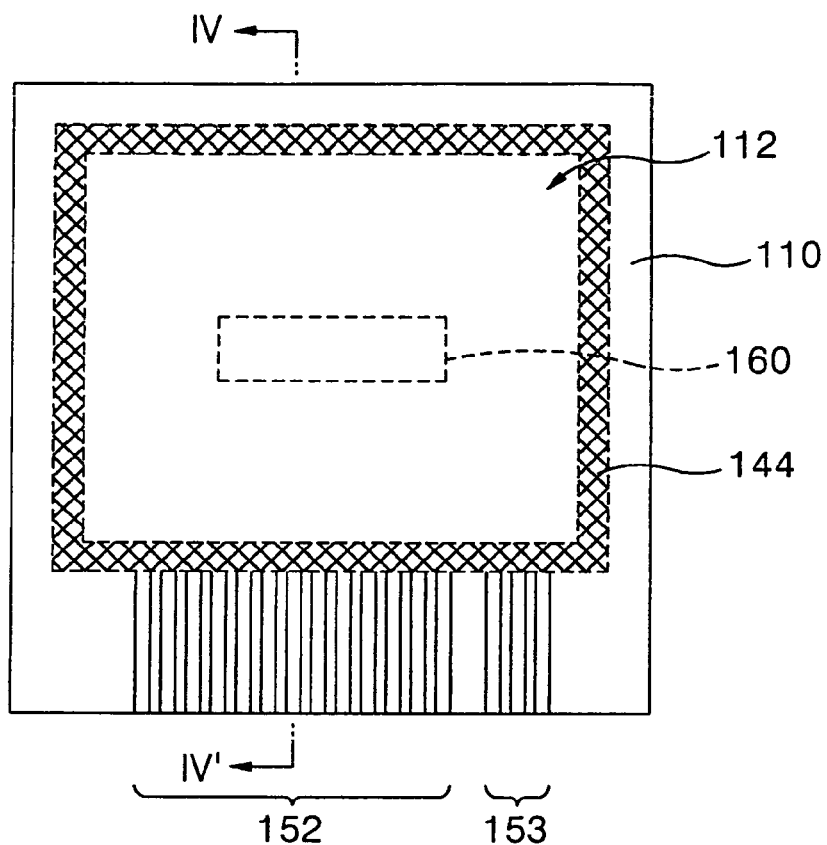
FIG. 3 is a plan view of the light emitting device according to a first embodiment of the present invention.
Figure 4:
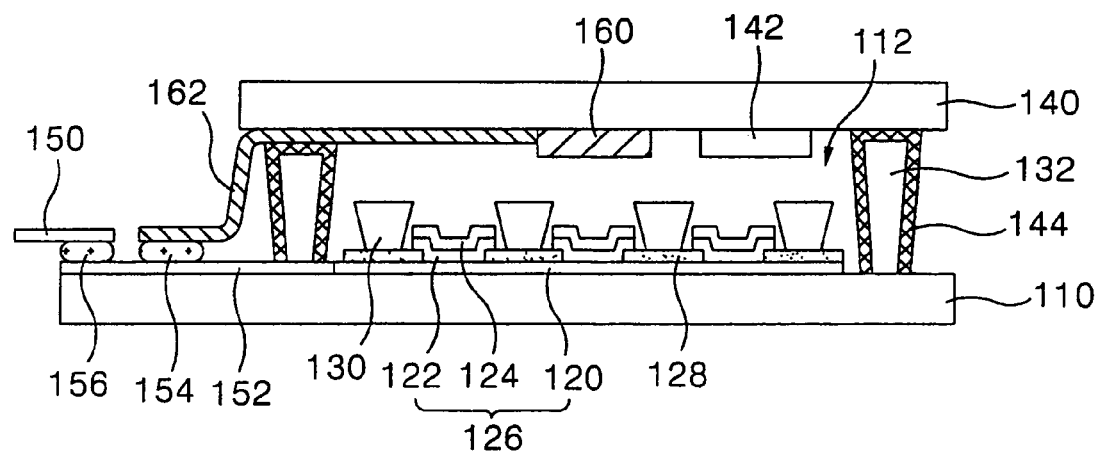
FIG. 4 is a cross-sectional view of the light emitting device of FIG. 3, as taken along line IV-IV'.

FIG. 3 is a plan view of the light emitting device according to a first embodiment of the present invention. FIG. 4 is a cross-sectional view of the light emitting device of FIG. 3, as taken along line IV-IV'.

The light emitting device according to the first embodiment of the present invention comprises an active area 112 disposed on the substrate 110, at least one outer wall 132 disposed at the periphery of the active area 112, a flat cap 140 surrounding the active area 112, and a driving chip 160 disposed on the substrate-forward surface of the cap 140 to drive pixels 126.

Also, the light emitting device according to the present embodiment further comprises a pad 152 disposed on the substrate 110 and electrically communicated with the active area 112, a signal transferring film 162 electrically communicated with the driving chip 160, and a conductive bonding film 154 for electrically communicating the signal transferring film 162 with the pad 152.

The active area 112 comprises anode electrode layers 120 disposed on the substrate 110 in one direction, insulating layers 128, having apertures, disposed on the anode electrode layers 120, luminescent layers 124 disposed on the apertures, cathode electrode layers 122 disposed on the anode electrode layers 120 in perpendicular direction to the anode electrode layers 120, and inner walls 130 disposed on the insulating layers 128 to partition the luminescent layers 124 and the cathode electrode layers 122.

Here, for the convenience of explanation, an organic electroluminescent device in which the luminescent layer 124 is an organic material layer will be explained as the light emitting device according to the present embodiment. In the device, the order of stacking the anode electrode layer 120, the luminescent layer 124, and the cathode electrode layer 122 can be reversed.

The anode electrode layer 120 can be a transparent electrode layer. A plurality of anode electrode layers 120 are formed spaced from each other on the substrate 110. Data signal is transferred from the driving chip 160 to the anode electrode layer 120. The luminescent layer 124 is formed on the anode electrode layer 120. A plurality of cathode electrode layers 122 are formed to cross the anode electrode layer 120 on the luminescent layers 124. Scan signal is transferred from the driving chip 160 to the cathode electrode layer 122.

The insulating layers 128 are formed on the substrate 110 on which the anode electrode layers 120 is disposed, to have apertures at the corresponding areas to the pixels 126.

A plurality of inner walls 130 are formed in the direction which crosses the anode electrode layers 120, to partition the pixels 126. The shape of the inner wall 130 is an overhang type that the upper part of the inner wall 130 is wider than the bottom part of the inner wall 130.

The outer walls 132 are formed at the periphery of the active area 112, and can be formed together with the inner walls 130 simultaneously. The outer wall can be one or plural walls to surround the periphery of the active area 112. The outer wall 132 is higher than the inner wall 130, which prevents the elements disposed in the active area 112 from contacting each other.

The cap 140 covers the active area 112 to protect the pixels 126 from oxygen or moisture existing in the air. The cap 140 can be made of glass or metal, and has a flat plate shape.

A getter 142 for absorbing oxygen and moisture is attached onto the substrate-forward surface of the cap. The getter 142 absorbs moisture and oxygen existing in the space formed by the cap 140 and the substrate 110, to prevent degradation of the device and extend life of the device. The driving chip 160 is installed on the substrate-forward surface of the cap 140.

The sealant 144 is applied onto the outer wall 132 and/or the substrate 110 to bond the cap 140 to the substrate 110.

The pad 152 is formed on the substrate 110 to electrically communicate with the anode electrode layer 120 and the cathode electrode layer 122 disposed in the active area 112. An external signal pad 153 to which external signals are transferred from the external device (not shown) can be formed on the substrate 110 separately. The external signal pad 153 is electrically communicated with an external signal transferring film 150 transferring external signals from the external device, and is electrically communicated with a signal transferring film 162. A flexible film is preferable as the external signal transferring film 150 and the signal transferring film 162. Also, the external signal transferring film 150 and the signal transferring film 162 are electrically bonded to the external signal pad 153 by the conductive bonding films 156 and 154, respectively. An anisotrophic conductive film is preferable as the conductive bonding films 154 and 156.

The signal transferring film 162 is electrically communicated with the pad 152 and the driving chip 160. One side of the signal transferring film 162 is electrically bonded to the pad 152 and the external signal pad 153 by the conductive bonding films 154, and the other side of the signal transferring film 162 passes through the sealant 144 to electrically communicate with the driving chip 160.

The driving chip 160 generates data signal and scan signal, responding to control signal transferred from the external device through the external signal pad 153 and the signal transferring film 162. And, the data signal and scan signal generated from the driving chip 160 are transferred to the active area 112 through the signal transferring film 162 and the pad 152. Therefore, the active area 112 is emitted.

Figure 5:
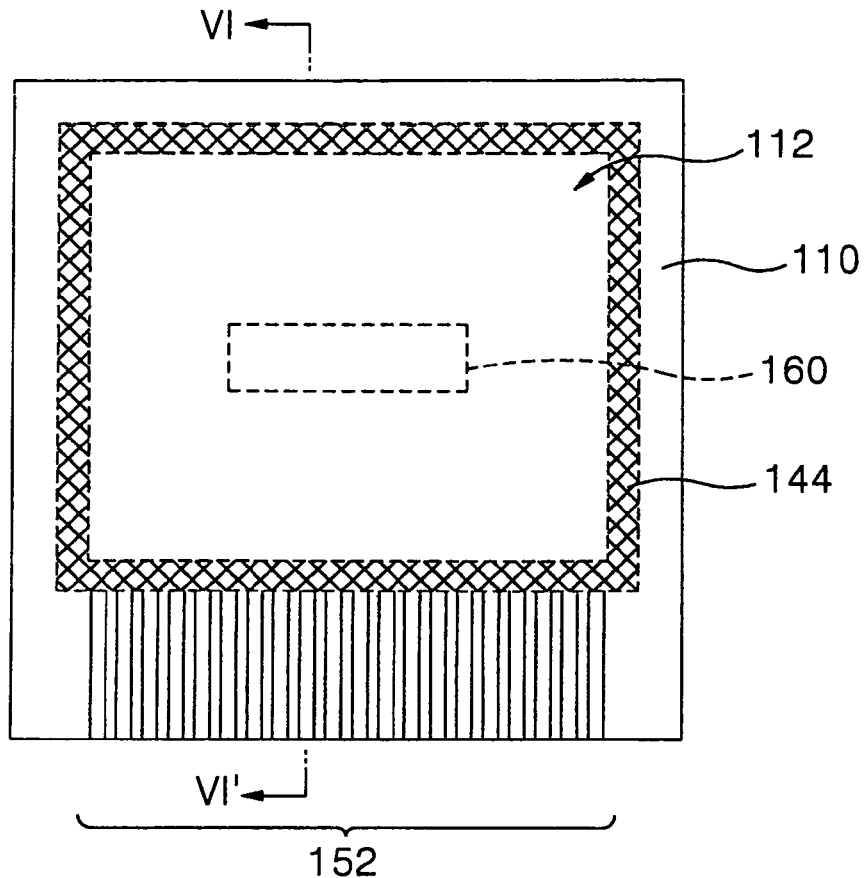
FIG. 5 is a plan view of the light emitting device according to a second embodiment of the present invention.
Figure 6:
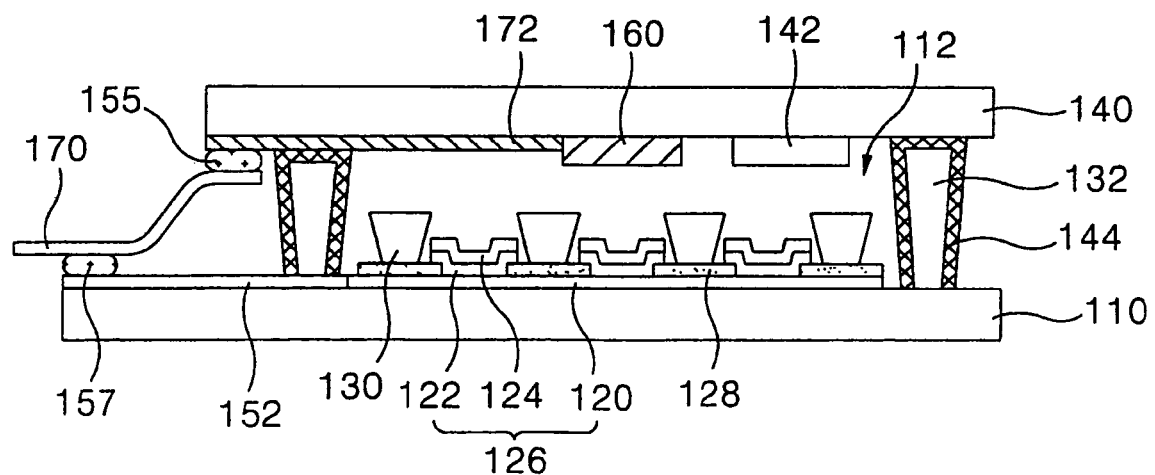
FIG. 6 is a cross-sectional view of the light emitting device of FIG. 5, as taken along line V-V'.

FIG. 5 is a plan view of the light emitting device according to a second embodiment of the present invention. FIG. 6 is a cross-sectional view of the light emitting device of FIG. 5, as taken along line V-V'.

The light emitting device according to the second embodiment of the present invention comprises an active area 112 disposed on the substrate 110, at least one outer wall 132 disposed at the periphery of the active area 112, a flat cap 140 surrounding the active area 112, and a driving chip 160 disposed on the substrate-forward surface of the cap to drive pixels 126.

Also, the light emitting device according to the present embodiment further comprises a pad 152 disposed on the substrate 110 and electrically communicated with the active area 112, a signal line 172 electrically communicated with the driving chip 160, a signal transferring film 170 electrically communicated with the pad 152 and the signal line 172, and conductive bonding films 157 and 155 for electrically connecting the signal transferring film 170 with the pad 152 and the signal line 172.

Figure 1:
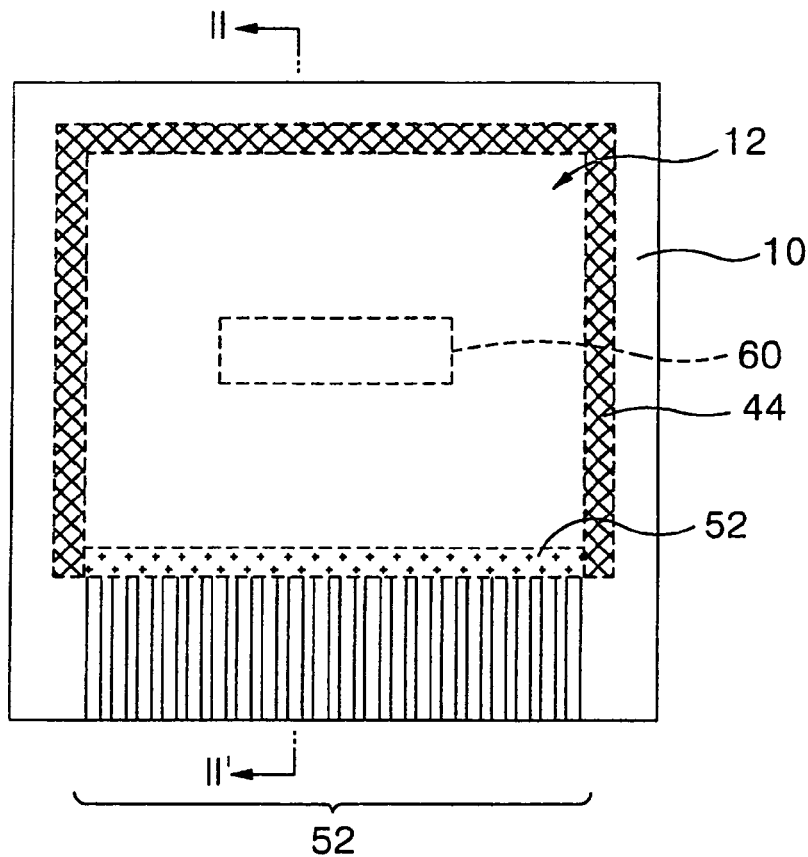
FIG. 1 is a plan view of an organic electroluminescent device in the related art.
Figure 2:
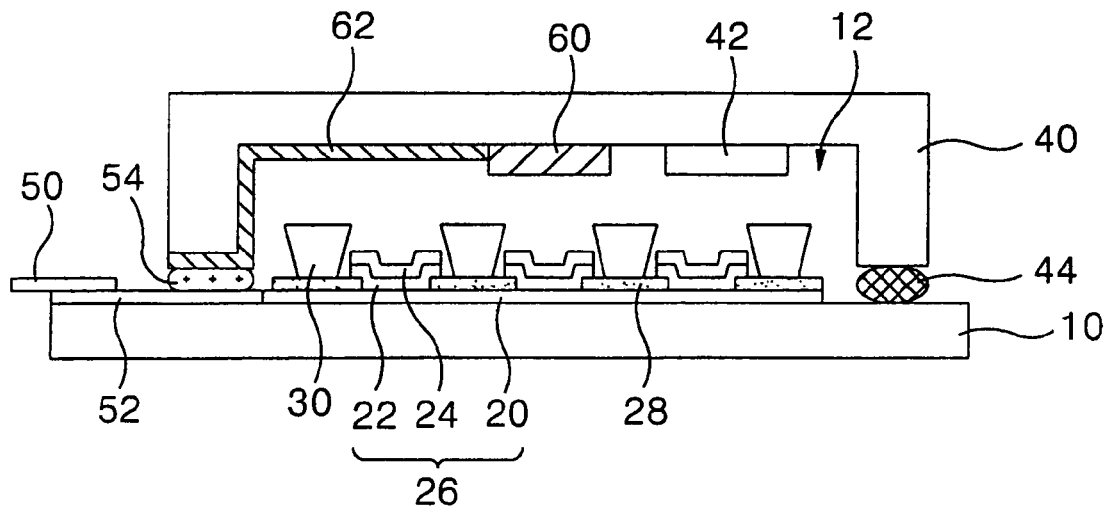
FIG. 2 is a cross-sectional view of the organic electroluminescent device of FIG. 1, as taken along line II-II'

The active area 112, the inner wall 130, the outer wall 132, the cap 140, the driving chip 160, and the sealant 144 are the same elements as those of the light emitting device according to the first embodiment illustrated in FIG. 2. Therefore, the explanations for these elements are omitted.

The signal lines 172 are formed on the substrate-forward surface of the cap 140, and are electrically communicated with the driving chip 160. The signal lines 172 pass through the sealant 144 to electrically communicate with the signal transferring film 170.

The signal transferring film 170 transfers external signals transferred from the external device, to the driving chip 160 through a part of the signal lines 172. And, the signal transferring film 170 transfers data signal and scan signal which are transferred from the driving chip 160, to the pad 152 through the remaining part of the signal lines 172. The signal transferring film 170 is electrically bonded to the signal lines 172 by the conductive bonding film 155, and is electrically bonded to the pad 152 by the conductive bonding film 157. An anisotrophic conductive film is preferable as the conductive bonding films 156 and 154.

The pad 152 is formed on the substrate 110, and transfers data signal and scan signal which are transferred from the driving chip 160 through the signal transferring film 170 and the signal lines 172, to the anode electrode layer 120 and the cathode electrode layer 122 disposed in the active area 120. Therefore, the active area 120 is emitted.

From the above preferred embodiments for the present invention, it is noted that modifications and variations can be made by a person skilled in the art in light of the above teachings. Therefore, it should be understood that changes may be made for a particular embodiment of the present invention within the scope and the spirit of the present invention outlined by the appended claims.

What is claimed is:

1. An organic electroluminescent device, comprising:
a substrate;
anode electrode layers disposed over the substrate in a first direction;
cathode electrode layers disposed over or under the anode electrode layers in a second direction that is different from the first direction;
organic material layers disposed between the anode electrode layers and the cathode electrode layers;
at least one outer wall disposed at the periphery of an active area defined by an entire area of the organic material layers;
a cap attached over the at least one outer wall, wherein a substrate-forward surface of the cap is flat;
a driving chip attached to the substrate-forward surface of the cap;
a signal transferring part configured to electrically communicate with the driving chip, and the signal transferring part to extend to an outside of an area defined by the substrate and the cap;
a pad disposed over the substrate, and the pad configured to electrically communicate with the anode electrode layers and/or the cathode electrode layers and electrically bonded to the signal transferring part at the outside of the area; and
an external signal transferring part configured to electrically communicate with the signal transferring part and to transfer an external signal to the driving chip, wherein the at least one outer wall is an insulating material.

2. The organic electroluminescent device of claim 1, further comprising sealant to bond the cap to the at least one outer wall.

3. The organic electroluminescent device of claim 1, further comprising a getter attached to the substrate-forward surface of the cap.

4. The organic electroluminescent device of claim 1, further comprising a plurality of inner walls disposed in the active area to divide the organic material layers.

5. The organic electroluminescent device of claim 4, wherein the at least one outer wall and the inner walls are formed simultaneously.

6. The organic electroluminescent device of claim 4, wherein a height of the at least one outer wall is greater than a height of each of the inner walls.

7. The organic electroluminescent device of claim 1, wherein the external signal transferring part is a flexible film.

8. The organic electroluminescent device of claim 1, wherein the signal transferring part extends between the cap and the at least one outer wall.

9. The organic electroluminescent device of claim 1, wherein the signal transferring part is a flexible film.

10. The organic electroluminescent device of claim 1, further comprising a conductive bonding film to bond the signal transferring part to the pad, and
wherein a driving signal is transferred from the driving chip to the anode electrode layers and/or the cathode electrode layers through the signal transferring part and the pad.

11. The organic electroluminescent device of claim 1, further comprising an external signal pad over the substrate, wherein the external signal pad electrically communicates with the signal transferring part and the external signal transferring part.

12. The organic electroluminescent device of claim 11, further comprising a conductive bonding film to bond the external signal pad to the signal transferring part and to the external signal transferring part, and
wherein the external signal is transferred to the driving chip through the external signal transferring part, the external signal pad and the signal transferring part.

13. The organic electroluminescent device of claim 1, wherein
the signal transferring part is a signal line disposed on the substrate-forward surface of the cap.

14. The organic electroluminescent device of claim 1, wherein
the external signal transferring part further electrically communicates with the pad.

15. The organic electroluminescent device of claim 14, further comprising a conductive bonding film to bond the external signal transferring part to the pad, and
wherein a driving signal is transferred from the driving chip to the anode electrode layers and/or the cathode electrode layers through the signal transferring part, the external signal transferring part and the pad.

16. The organic electroluminescent device of claim 1, further comprising a conductive bonding film to bond the external signal transferring part to the signal transferring part, and
wherein the external signal is transferred to the driving chip through the external signal transferring part and the signal transferring part.

17. A light emitting device, comprising:
a substrate;
pixels disposed over the substrate;
at least one outer wall disposed at a periphery of an active area defined by an entire area of the pixels;
a cap attached over the at least one outer wall;
a driving chip attached to a substrate-forward surface of the cap;
a signal transferring part configured to electrically communicate with the driving chip, the signal transferring part to extend outside of an area defined by the substrate and the cap;
a pad disposed over the substrate, and the pad configured to electrically communicate with the pixels and electrically bonded to the signal transferring part at the outside of the area; and
an external signal transferring part configured to electrically communicate with the signal transferring part and to transfer an external signal to the driving chip, wherein the at least one outer wall is an insulating material.

18. The light emitting device of claim 17, wherein the pixels comprise:
anode electrode layers disposed over the substrate in a first direction;
cathode electrode layers disposed over or under the anode electrode layers in a second direction that is different from the first direction; and
luminescent layers disposed between the anode electrode layers and the cathode electrode layers.

19. The light emitting device of claim 18, wherein
the luminescent layer is an organic electroluminescent layer.

20. The light emitting device of claim 17, wherein the signal transferring part extends between the cap and the at least one outer wall.

21. The light emitting device of claim 17,
wherein the signal transferring part electrically contacts the pad, and
wherein a driving signal is transferred from the driving chip to the pixels through the signal transferring part and the pad.

22. The light emitting device of claim 17, further comprising an external signal pad over the substrate,
wherein the external signal pad electrically contacts the signal transferring part and the external signal transferring part, and
wherein the external signal is transferred to the driving chip through the external signal transferring part, the external signal pad and the signal transferring part.

23. The light emitting device of claim 17,
wherein the external signal transferring part electrically contacts the pad, and
wherein a driving signal is transferred from the driving chip to the pixels through the signal transferring part, the external signal transferring part and the pad.

24. The light emitting device of claim 17,
wherein the external signal transferring part electrically contacts the signal transferring part, and
wherein the external signal is transferred to the driving chip through the external signal transferring part and the signal transferring part.

* * * * *